United States Patent
Yamada et al.

(10) Patent No.: US 8,653,563 B2
(45) Date of Patent: Feb. 18, 2014

(54) SEMICONDUCTOR DEVICE

(71) Applicant: Sumitomo Electric Industries, Ltd., Osaka (JP)

(72) Inventors: Fumio Yamada, Osaka (JP); Takeshi Araya, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 13/628,405

(22) Filed: Sep. 27, 2012

(65) Prior Publication Data

US 2013/0075753 A1    Mar. 28, 2013

(30) Foreign Application Priority Data

Sep. 27, 2011    (JP) ................. 2011-211096

(51) Int. Cl.
| | | |
|---|---|---|
| H01L 29/15 | (2006.01) | |
| H01L 31/0312 | (2006.01) | |
| H01L 31/0256 | (2006.01) | |
| H01L 29/778 | (2006.01) | |
| H01L 29/66 | (2006.01) | |
| H01L 31/06 | (2012.01) | |
| H01L 21/337 | (2006.01) | |
| H01L 21/00 | (2006.01) | |

(52) U.S. Cl.
USPC .............. 257/194; 257/76; 257/77; 257/183; 257/201; 438/189; 438/460; 438/478; 438/493

(58) Field of Classification Search
USPC .............. 257/76, 77, 194, 183, 201; 438/460, 438/489, 478, 493
See application file for complete search history.

(56) References Cited

U.S. PATENT DOCUMENTS

| | | | |
|---|---|---|---|
| 2004/0155260 A1* | 8/2004 | Kuzmik ..................... 257/192 |
| 2004/0201038 A1* | 10/2004 | Kimura et al. ................ 257/192 |
| 2006/0278892 A1* | 12/2006 | Harris et al. .................. 257/194 |
| 2009/0072252 A1* | 3/2009 | Son et al. ........................ 257/94 |
| 2010/0243989 A1 | 9/2010 | Makabe et al. |
| 2011/0005942 A1* | 1/2011 | Kohn et al. ............... 205/794.5 |
| 2011/0024796 A1* | 2/2011 | Miyoshi et al. .............. 257/194 |
| 2011/0031532 A1* | 2/2011 | Kikkawa et al. ............. 257/194 |
| 2013/0181224 A1* | 7/2013 | Lim et al. ........................ 257/76 |

FOREIGN PATENT DOCUMENTS

JP    2010-232377 A    10/2010

* cited by examiner

*Primary Examiner* — Ha Tran T Nguyen
*Assistant Examiner* — Thai T Vuong
(74) *Attorney, Agent, or Firm* — Westerman, Hattori, Daniels & Adrian, LLP

(57) ABSTRACT

A semiconductor device includes: a substrate comprised of gallium nitride; an active layer provided on the substrate; a first buffer layer that is provided between the substrate and the active layer and is comprised of indium aluminum nitride ($In_xAl_{1-x}N$, $0.15 \leq x \leq 0.2$); and a spacer layer that is provided between the first buffer layer and the active layer and is comprised of aluminum nitride having a thickness of 1 nm or more to 10 nm or less.

19 Claims, 3 Drawing Sheets

SEMICONDUCTOR DEVICE

CROSS-REFERENCE TO RELATED APPLICATION

This application is based upon and claims the benefit of priority of the prior Japanese Patent Application No. 2011-211096, filed on Sep. 27, 2011, the entire contents of which are incorporated herein by reference.

BACKGROUND (i) Technical Field
The present invention relates to a semiconductor device.
(ii) Related Art
A HEMT (High Electron Mobility Transistor) using nitride semiconductor is being used as an output amplifier element for a high frequency wave. The HEMT uses a two-dimensional electron gas (2DEG) generated at an interface between a channel layer and an electron supply layer as a carrier. There is a HEMT using a semiconductor substrate. When a trap in the substrate captures an electron in the 2DEG, a current may be reduced. And a leak current may occur because of the conductivity of the substrate. There is a case where a buffer layer is provided in order to restrain the current reduction and the leak current. Japanese Patent Application Publication No. 2010-232377 discloses an invention in which a composition ratio of aluminum (Al) in the buffer layer is adjusted.

SUMMARY

It is an object to provide a semiconductor device having a lattice-matched buffer layer with a channel layer, and a joint interface having good flatness.

According to an aspect of the present invention, there is provided a semiconductor device including: a substrate comprised of gallium nitride; an active layer provided on the substrate; a first buffer layer that is provided between the substrate and the active layer and is comprised of indium aluminum nitride ($In_xAl_{1-x}N$, $0.15 \leq x \leq 0.2$); and a spacer layer that is provided between the first buffer layer and the active layer and is comprised of aluminum nitride having a thickness of 1 nm or more to 10 nm or less.

According to an aspect of the present invention, there is provided a semiconductor device including: a substrate comprised of gallium nitride; an active layer provided on the substrate; a first buffer layer that is provided between the substrate and the active layer and is comprised of indium aluminum nitride ($In_xAl_{1-x}N$, $0.15 \leq x \leq 0.2$); and a second buffer layer that is provided between the substrate and the first buffer layer and is comprised of i-type gallium nitride or insulating gallium nitride.

DETAILED DESCRIPTION

When gallium nitride (GaN) is used as a material of a semiconductor substrate, the substrate is an n-type GaN substrate. Energy of a conduction band of the n-type GaN substrate is low. Therefore, a large leak current tends to occur. And so, it is required that a buffer layer having a high barrier is provided between the substrate and a channel layer. When aluminum gallium nitride (AlGaN) or the like is used as a material of the buffer layer, crystallinity of the channel layer may be degraded because of large lattice-mismatch between GaN and AlGaN. And a trap may occur. And the flatness of a joint interface between the buffer layer and the channel layer may get worse.

Figure 1A:
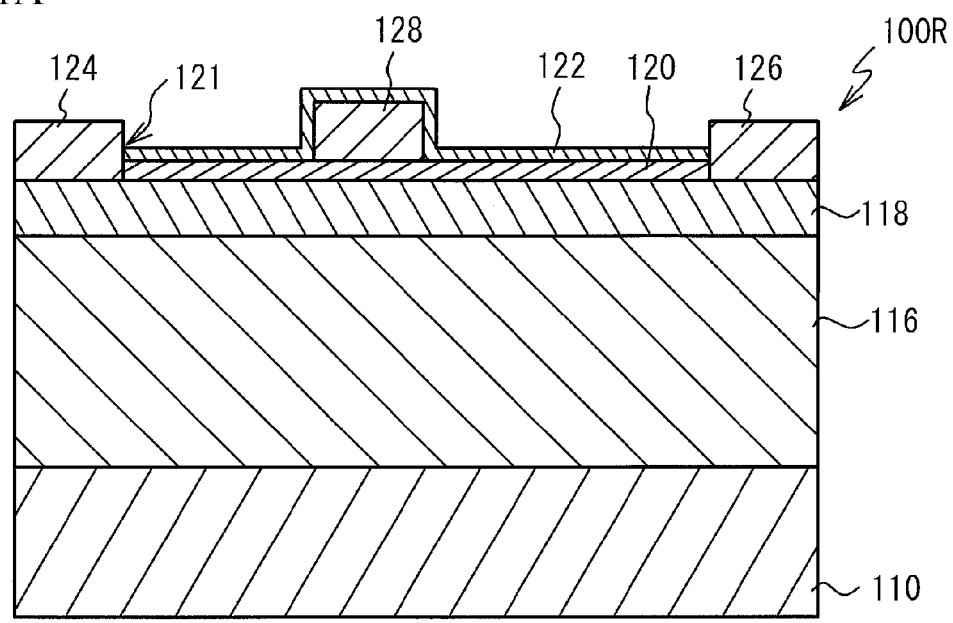
FIG. 1A illustrates a cross sectional view of a HEMT in accordance with a comparative example.

A description will be given of a comparative example. The comparative example is an example without a buffer layer. FIG. 1A illustrates a cross sectional view of a HEMT in accordance with the comparative example.

As illustrated in FIG. 1A, in a HEMT 100R in accordance with the comparative example, a channel layer 116 is provided on a substrate 110. An electron supply layer 118 is provided on the channel layer 116. A cap layer 120 is provided on the electron supply layer 118. A source electrode 124 and a drain electrode 126 are provided on a part of the electron supply layer 118 exposed from a recess 121 formed in the cap layer 120. A gate electrode 128 is provided on the cap layer 120. A protection layer 122 is provided on the electron supply layer 118 and the gate electrode 128.

The substrate 110 is formed with an n-type GaN (n-GaN) having a thickness of 100 μm of which impurity concentration is $1 \times 10^{17}$ cm$^{-3}$. Thus, the substrate 110 is conductive. A dopant is silicon (Si) or the like. The channel layer 116 is formed with i-GaN. The electron supply layer 118 is, for example, formed with aluminum gallium nitride (AlGaN) having a thickness of 22 nm of which composition ratio of Aluminum (Al) is 25%. The cap layer 120 is, for example, formed with n-GaN having a thickness of 5 nm of which carrier concentration is $1 \times 10^{18}$ cm$^{-3}$. The protection layer 122 is formed with an insulating material such as silicon nitride (SiN). The source electrode 124 and the drain electrode 126 are an ohmic electrode in which a titanium layer and aluminum layer (Ti/Al) are laminated in this order from the electron supply layer 118 side. The gate electrode 128 is an electrode in which a nickel layer and a gold layer (Ni/Au) are laminated in this order from the cap layer 120 side.

Figure 1B:
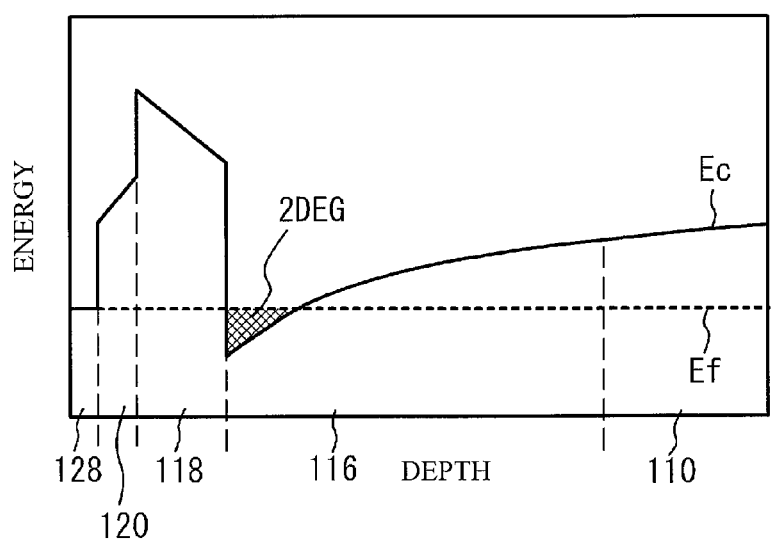
FIG. 1B illustrates an energy band of the HEMT of the comparative example.

FIG. 1B illustrates an energy band diagram of the HEMT of the comparative example. A horizontal axis indicates a depth of the HEMT in a lamination direction. A right end of the horizontal axis indicates a lower face of the substrate 110. A left end of the horizontal axis indicates an upper face of the cap layer 120. A vertical axis indicates the energy. A dotted line indicates a Fermi energy level Ef. A solid line indicates energy Ec of a conduction band. In FIG. 1B, each region corresponding to each member of the HEMT 100R is sectioned by a broken line. The members have the same numeral as FIG. 1A. A region of meshed lines indicates a 2DEG.

As illustrated in FIG. 1B, the energy Ec continuously changes between a substrate 110 and the channel layer 116. The energy difference of Ec is low. Therefore, an electron of the 2DEG tends to move toward the substrate 110 under high bias condition. Accordingly a leak current gets larger. A trap is formed in the substrate 110 because of an impurity or the like. The energy Ec around the 2DEG increases and the electron concentration of the 2DEG decreases, when the electron of the 2DEG is captured by the trap of the substrate 110. This results in reduction of a drain current.

[First Embodiment]

Figure 2A:
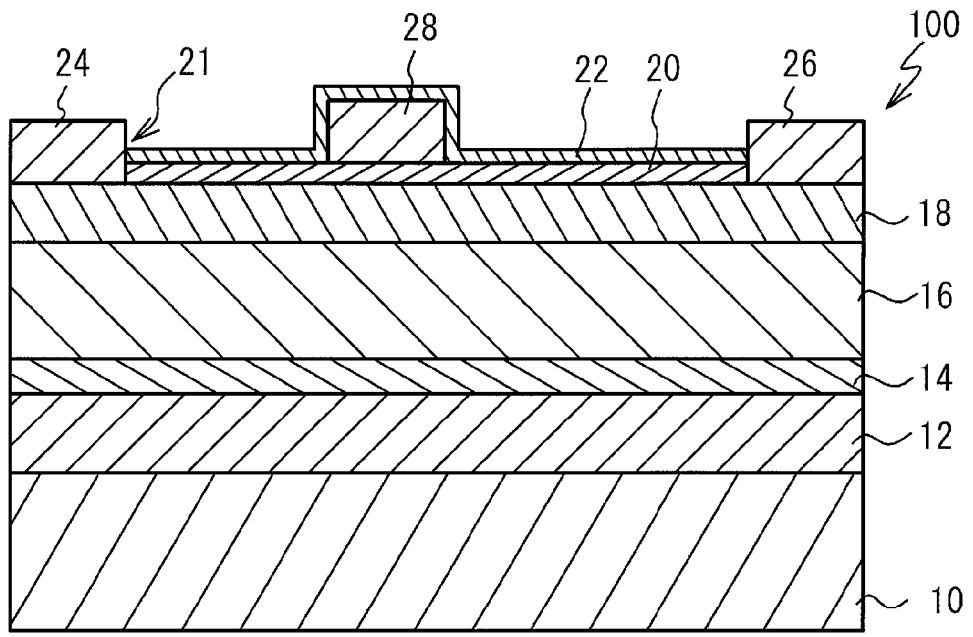
FIG. 2A illustrates a cross sectional view of a HEMT in accordance with a first embodiment.
Figure 2B:
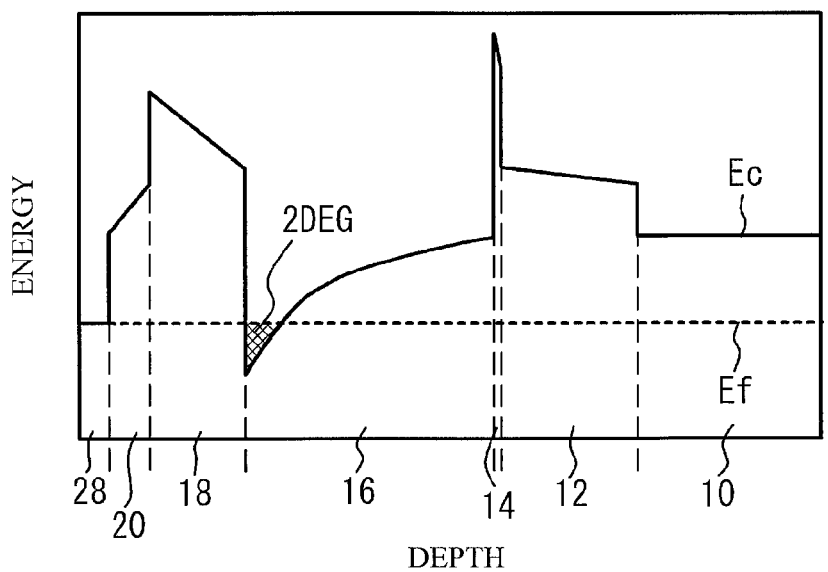
FIG. 2B illustrates an energy band of the HEMT of the first embodiment.

A first embodiment is an example in which a buffer layer is provided. FIG. 2A illustrates a cross sectional view of a HEMT in accordance with the first embodiment. FIG. 2B illustrates an energy band of the HEMT of the first embodiment. An explanation of the same structure as FIG. 1A is omitted.

As illustrated in FIG. 2A, in a HEMT 100 (semiconductor device) in accordance with the first embodiment, a first buffer layer 12 is provided on the substrate 10. A spacer layer 14 is provided on the first buffer layer 12. A channel layer 16 and an electron supply layer 18 acting as an active layer are laminated in this order on the spacer layer 14. A cap layer 20 and a protection layer 22 are laminated in this order on the electron supply layer 18. The first buffer layer 12 is contacting with an upper face of the substrate 10. The spacer layer 14 is contacting with an upper face of the first buffer layer 12. The channel layer 16 is contacting with an upper face of the spacer layer 14. The electron supply layer 18 is contacting with an upper layer of the channel layer 16. The cap layer 20 is contacting with an upper face of the electron supply layer 18. A source electrode 24 and a drain electrode 26 are contacting with an upper face of the electron supply layer 18. A gate electrode 28 is contacting with an upper face of the cap layer 20. The source electrode 24 and the drain electrode 26 are an electrode in which Ti/Al is laminated from the cap layer 20 side. The gate electrode 28 is an electrode in which Ni/Au is laminated from the cap layer 20 side.

The substrate 10 is, for example, formed with n-GaN having a thickness of 100 μm of which impurity concentration is $1 \times 10^{18}$ cm$^{-3}$. A dopant is silicon (Si). The substrate 10 may be formed with i-GaN other than n-GaN. The first buffer layer 12 is, for example, formed with indium aluminum nitride of which composition ratio of indium is 18% (In$_x$Al$_{1-x}$N, x=0.18) having a thickness of 0.3 μm. The spacer layer 14 is, for example, formed with aluminum nitride (AlN) having a thickness of 5 nm. The channel layer 16 is, for example, formed with i-GaN having a thickness of 0.3 μm. The other structure is the same as the comparative example.

As illustrated in FIG. 2B, the first buffer layer 12 generates a high barrier between the substrate 10 and the channel layer 16. This makes it difficult for the electron of the 2DEG to overcome the barrier and move to the substrate 10 through the barrier. Therefore, the leak current is suppressed. And it is restrained that the electron of the 2DEG is captured by the trap in the substrate 10. Therefore, reduction of the concentration of electron caused by the increase of the energy Ec around the 2DEG is retrained. This results in suppression of the reduction of the drain current.

The first buffer layer 12 is formed with a material of which band gap is larger than that of the channel layer 16 formed with GaN. When AlGaN is used as the first buffer later 12, the electron density may reduced by a trap caused by lattice mismatch. And so, InAlN is used because InAlN has a large band gap and achieves lattice matching with the channel layer 16 formed with GaN. When the lattice matching between the first buffer layer 12 and the channel layer 16 is achieved, crystallinity of the channel layer 16 is improved. And the occurrence of the trap may be reduced. This results in improving of the characteristic of the HEMT 100. In order to achieve the good lattice matching interface, it is preferable that a composition ratio of In of In$_x$Al$_{1-x}$N structuring the first buffer layer 12 is 15% or more to 20% or less (0.15≤x≤0.2). The composition ratio of In may be 16% or more to 19% or less, 17% or more to 18% or less, or more than 15% and less than 20%. This is because the lattice matching is difficult when the composition ratio of In is less than 15% or more than 20%. In order to form an effective barrier, it is preferable that a thickness of the first buffer layer 12 is 0.1 μm or more to 1 μm or less. When the thickness of the first buffer layer 12 is larger than 1 μm, the surface gets rough and the crystallinity gets lower.

when the above-mentioned InAlN is provided, the lattice matching with the channel layer 16 formed with GaN is achieved. However, the channel layer 16 is contacting with the first buffer layer 12, a joint interface between the first buffer layer 12 and the channel layer 16 gets rough, and the crystallinity of the channel layer 16 gets lower. The roughness of the joint interface occurs because of unevenness of crystal of the first buffer layer 12 caused by a difference of a growth temperature between the first buffer layer 12 of which growth temperature is lower and the channel layer 16 of which growth temperature is higher. This is because In of the first buffer layer 12 vaporizes or condense and the surface of the InAlN gets rough when the channel layer 16 of which growth temperature is higher is formed. In the first embodiment, the spacer layer 14 is provided between the first buffer layer 12 and the channel layer 16, and the roughness of the joint interface between the first buffer layer 12 and the channel layer 16 is suppressed. A joint interface having good flatness is formed between the first buffer layer 12 and the spacer layer 14 and between the spacer layer 14 and the channel layer 16. This results in improving of the crystallinity of the channel layer 16. However, when the spacer layer 14 is excessively thick, the lattice mismatch occurs between the spacer layer 14 and the channel layer 16, and a trap occurs. When the spacer layer 14 is excessively thin, it is difficult to form a flat joint interface. It is therefore preferable that the thickness of the spacer layer 14 is 1 nm or more to 10 nm or less. The thickness may be 2 nm to more and 8 nm or less, 3 nm or more to 7 nm or less, or more than 1 nm and less than 10 nm.

The concentration of impurity in the n-GaN of the substrate 10 may be $1 \times 10^{16}$ cm$^{-3}$ or more to $1 \times 10^{19}$ cm$^{-3}$ or less, $1 \times 10^{17}$ cm$^{-3}$ or more to $1 \times 10^{18}$ cm$^{-3}$ or less, or more than $1 \times 10^{16}$ cm$^{-3}$ and less than $1 \times 10^{19}$ cm$^{-3}$. The cap layer 20 may be provided or may not be provided. When the cap layer 20 is not provided, the source electrode 24, the drain electrode 26 and the gate electrode 28 are provided so as to contact with the upper face of the electron supply layer 18. When the cap layer 20 is provided, the source electrode 24 and the drain electrode 26 may be provided so as to contact with the upper face of the cap layer 20, in addition to the case of FIG. 2A.

The electrode may be a single layer or three or more layers. The electrode may be formed with a metal other than the above-mentioned material. The electron supply layer 18 may be formed with a nitride semiconductor other than InAlGaN. The cap layer 20 may be formed with nitride semiconductor other than the n-GaN. The nitride semiconductor is semiconductor including nitrogen (N). The nitride semiconductor may be indium gallium nitride (InGaN), indium nitride (InN), aluminum indium gallium nitride (AlInGaN) or the like. The electron supply layer 18 may be formed with InAlN or AlInGaN of the nitride semiconductors.

A description will be given of a method for manufacturing the HEMT 100 in accordance with the first embodiment. The first buffer layer 12 is formed on the substrate 10 by a MOCVD (Metal Organic Chemical Vapor Deposition) method. The growth conditions are as follows.

Material: TMA (Tri Methyl Aluminum), TMI (Tri Methyl Indium), and ammonia (NH$_3$)

Carrier Gas: nitrogen (N$_2$) and hydrogen (H$_2$)

Flow rate of TMA: 10 to 500 sccm ($1.69 \times 10^{-2}$ to $8.45 \times 10^{-1}$ Pa·m$^3$/s)

Flow rate of TMI: 10 to 500 sccm

Flow rate of NH$_3$: 0.1 to 100 slm ($1.69 \times 10^{-1}$ to $1.69 \times 10^{2}$ Pa·m$^3$/s)

Pressure in a furnace: atmospheric pressure (101.3 kPa) to 100 Torr (13.3 MPa)

Growth temperature (temperature of a substrate during growing): 500 to 1000 degrees C.

The spacer layer 14 is formed on the first buffer layer 12. The following conditions are used. The same conditions as the above conditions are omitted.

Material: TMA and $NH_3$

Growth temperature: 500 to 1200 degrees C.

The channel layer 16 is formed on the spacer layer 14.

Material: TMG (Tri Methyl gallium) and $NH_3$

Flow rate of TMG: 20 to 1000 sccm ($3.38 \times 10^{-2}$ to 1.69 $Pa \cdot m^3/s$)

Growth temperature: 800 to 1200 degrees C.

The electron supply layer 18 is formed on the channel layer 16.

Material: TMA, TMG and $NH_3$

Growth temperature: 700 to 1400 degrees C.

The cap layer 20 is formed on the electron supply layer 18.

Material: TMG and $NH_3$

Growth temperature: 800 to 1200 degrees C.

For example, a first SiN layer is formed on the cap layer 20. The first SiN layer is subjected to a patterning, and a part of the electron supply layer 18 is exposed. An ohmic electrode is formed on the exposed region of the electron supply layer 18 by a vapor deposition method. The ohmic electrode acts as the source electrode 24 and the drain electrode 26. After that, an annealing is performed. The first SiN layer is further subjected to another patterning, and another part of the electron supply layer 18 is exposed. For example, a schottky electrode is formed on the exposed region of the electron supply layer 18 by the vapor deposition method or the like. The schottky electrode acts as the gate electrode 28. After forming the schottly electrode, another annealing is performed. A second SiN layer is formed on the first SiN layer, the electron supply layer 18 and the gate electrode 28. The first SiN layer and the second SiN layer structure the protection layer 22. With the processes, the HEMT 100 is manufactured.

[Second Embodiment]

Figure 3:
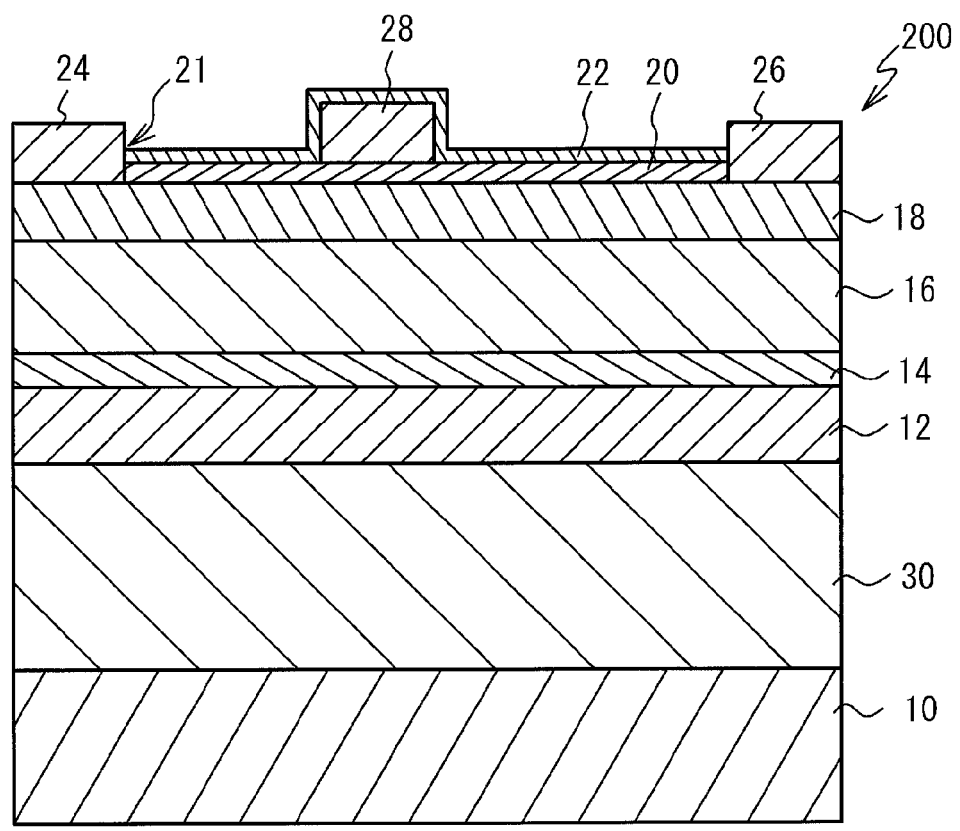
FIG. 3 illustrates a cross sectional view of a HEMT in accordance with a second embodiment.

A second embodiment is an embodiment in which a second buffer layer is provided. FIG. 3 illustrates a cross sectional view of a HEMT 200 in accordance with a second embodiment.

As illustrated in FIG. 3, in the HEMT 200 of the second embodiment, a second buffer layer 30 is provided between the substrate 10 and the first buffer layer 12. The second buffer layer 30 is contacting with the upper face of the substrate 10. The first buffer layer 12 is contacting with an upper face of the second buffer layer 30. The second buffer layer 30 is formed with i-GaN having a thickness of 10 μm or more to 100 μm or less. Other structure is the same as FIG. 2A. Therefore, an explanation is omitted.

In accordance with the second embodiment, the second buffer layer 30 is provided. Therefore, an insulation characteristic between the substrate 10 and the channel layer 16 is improved. And, a distance between the substrate 10 and the channel layer 16 is enlarged. Thus, the characteristic of the HEMT 200 during a high frequency operation and a high output operation is improved. It is possible to enlarge the thickness of the first buffer layer 12. However, growing speed of the InAlN of the first buffer layer 12 is low (for example, 1 μm/h). Therefore, it is difficult to manufacture the HEMT effectively. In contrast, the growing speed of i-GaN of the second buffer layer 30 is high (for example, 10 μm/h). Therefore, the manufacturing process of the HEMT gets effective. And, it is possible to reduce the cost of the HEMT. The thickness of the second buffer layer 30 may be 20 μm or more to 90 μm or less, 30 μm or more to 80 μm or less, or more than 10 μm and less than 100 μm. The second buffer layer 30 may be formed with SI—GaN (Semi insulating gallium nitride) or the like. The SI—GaN is GaN in which iron (Fe) or the like is doped. The spacer layer 14 may be provided or may not be provided. When the spacer layer 14 is provided in the second embodiment as well as the first embodiment, the roughness of the joint interface between the first buffer layer 12 and the channel layer 16 is restrained, and the channel layer 16 having preferable crystallinity can be formed.

The present invention is not limited to the specifically disclosed embodiments and variations but may include other embodiments and variations without departing from the scope of the present invention.

What is claimed is:

1. A semiconductor device comprising:
   a substrate comprised of gallium nitride;
   an active layer provided on the substrate;
   a first buffer layer that is provided between the substrate and the active layer and is comprised of indium aluminum nitride ($In_xAl_{1-x}N$, $0.15 \leq x \leq 0.2$); and
   a spacer layer that is provided between the first buffer layer and the active layer and is comprised of aluminum nitride having a thickness of 1 nm or more to 10 nm or less.

2. The semiconductor device as claimed in claim 1, wherein the active layer includes a channel layer and an electron supply layer provided on the channel layer.

3. The semiconductor device as claimed in claim 1 further comprising a second buffer layer that is provided between the substrate and the first buffer layer and is comprised of i-type gallium nitride or semi-insulating gallium nitride.

4. The semiconductor device as claimed in claim 3, wherein a thickness of the second buffer layer is 10 μm or more to 100 μm or less.

5. The semiconductor device as claimed in claim 1, wherein conductivity of the substrate is n-type.

6. The semiconductor device as claimed in claim 5, wherein a concentration of impurity in the substrate is $1 \times 10^{16}$ $cm^{-3}$ or more to $1 \times 10^{19}$ $cm^{-3}$ or less.

7. The semiconductor device as claimed in claim 6, wherein the impurity is silicon.

8. The semiconductor device as claimed in claim 1, wherein conductivity of the substrate is i-type.

9. The semiconductor device as claimed in claim 2, wherein the electron supply layer is comprised of aluminum gallium nitride or indium aluminum nitride.

10. The semiconductor device as claimed in claim 2, wherein the channel layer is comprised of i-type gallium nitride.

11. A semiconductor device comprising:
    a substrate comprised of gallium nitride;
    an active layer provided on the substrate;
    a first buffer layer that is provided between the substrate and the active layer and is comprised of indium aluminum nitride ($In_xAl_{1-x}N$, $0.15 \leq x \leq 0.2$); and
    a second buffer layer that is provided between the substrate and the first buffer layer and is comprised of i-type gallium nitride or insulating gallium nitride.

12. The semiconductor device as claimed in claim 11, wherein the active layer includes a channel layer and an electron supply layer provided on the channel layer.

13. The semiconductor device as claimed in claim 11, wherein a thickness of the second buffer layer is 10 μm or more to 100 μm or less.

14. The semiconductor device as claimed in claim 11 further comprising a spacer layer that is provided between the first buffer layer and the active layer and is comprised of aluminum nitride having a thickness of 1 nm or more to 10 nm or less.

15. The semiconductor device as claimed in claim 11, wherein conductivity of the substrate is n-type.

16. The semiconductor device as claimed in claim 15, wherein a concentration of impurity in the substrate is $1\times10^{16}$ $cm^{-3}$ or more to $1\times10^{19}$ $cm^{-3}$ or less.

17. The semiconductor device as claimed in claim 16, wherein the impurity is silicon.

18. The semiconductor device as claimed in claim 12, wherein the electron supply layer is comprised of aluminum gallium nitride or indium aluminum nitride.

19. The semiconductor device as claimed in claim 12, wherein the channel layer is comprised of i-type gallium nitride.

\* \* \* \* \*